(12) United States Patent
Horger et al.

(10) Patent No.: US 7,705,597 B2
(45) Date of Patent: Apr. 27, 2010

(54) MAGNETIC RESONANCE METHOD AND APPARATUS FOR GENERATING DIFFERENT WEIGHTED IMAGES FROM THE SAME MAGNETIC RESONANCE ECHO SIGNAL EVOLUTION

(75) Inventors: Wilhelm Horger, Schwaig (DE); John Mugler, Charlottesville, VA (US)

(73) Assignees: Siemens Aktiengesellschaft, Munich (DE); University of Virginia, Patent Foundation, Charlottesville, VA (US)

( * ) Notice: Subject to any disclaimer, the term of this patent is extended or adjusted under 35 U.S.C. 154(b) by 0 days.

(21) Appl. No.: 12/194,919

(22) Filed: Aug. 20, 2008

(65) Prior Publication Data

US 2010/0045288 A1 Feb. 25, 2010

(51) Int. Cl.
*G01V 3/00* (2006.01)
(52) U.S. Cl. .................................. 324/309; 324/307
(58) Field of Classification Search ................. 324/309, 324/307
See application file for complete search history.

(56) References Cited

U.S. PATENT DOCUMENTS

| | | | |
|---|---|---|---|
| 5,229,717 A | * | 7/1993 | Hinks .......................... 324/309 |
| 6,198,960 B1 | * | 3/2001 | Fain et al. .................... 600/419 |
| 6,804,546 B1 | * | 10/2004 | Thompson et al. ........... 600/410 |
| 7,164,268 B2 | | 1/2007 | Mugler, III et al. |
| 7,254,437 B2 | * | 8/2007 | Miyazaki ..................... 600/410 |

OTHER PUBLICATIONS

"Practical Implementation of Optimized Tissue-Specific Prescribed Signal Evolutions for Improved Turbo-Spin-Echo Imaging," Mugler et al, Proc. Intl. Soc. Mag. Reson. Med. 11 (2003) p. 203.

* cited by examiner

*Primary Examiner*—Louis M Arana
(74) *Attorney, Agent, or Firm*—Schiff Hardin LLP

(57) ABSTRACT

In a method and an apparatus for acquiring magnetic resonance data, a region of a subject is exposed to a spin echo magnetic resonance pulse sequence that includes a refocusing radio-frequency pulse flip angle evolution that causes magnetic resonance signals to be emitted from the region with a signal evolution following each excitation radio-frequency pulse. The signal evolution is sampled to extract two or more sets of sampled data therefrom respectively with different contrast weightings of tissues in the region. The multiple sets of sampled data are made available as respective outputs in a form allowing multiple different images of the region to be generated therefrom, respectively with said different contrast weightings. For example, a spin density-weighted image and a T2-weighted image, or a T2-weighted image and a heavily T2-weighted image, thus can be generated by sampling from the same variable-flip-angle echo train.

17 Claims, 3 Drawing Sheets

MAGNETIC RESONANCE METHOD AND APPARATUS FOR GENERATING DIFFERENT WEIGHTED IMAGES FROM THE SAME MAGNETIC RESONANCE ECHO SIGNAL EVOLUTION

BACKGROUND OF THE INVENTION

1. Field of the Invention

The present invention concerns a method for acquiring magnetic resonance data with different types of weightings, as well as a magnetic resonance data acquisition system with which such a method can be implemented.

2. Description of the Prior Art

Magnetic resonance technology has been increasingly used in recent years to generate cross-sectional images of the human body since, relative to other medical imaging modalities such as, for example, radioscopy with x-rays or computed tomography, it has among other things, the advantage that patient and medical personal are subjected to no ionizing radiation exposure.

Magnetic resonance (MR) technology is a known technology with which images of the inside of an examination subject can be generated. For this purpose, the examination subject is positioned in a strong, static, homogeneous basic magnetic field (field strengths of less than 0.2 Tesla to 7 Tesla and higher) in an MR apparatus so that the subject's nuclear spins become preferentially oriented along the basic magnetic field. The examination subject is exposed to radio-frequency (RF) excitation pulses to excite nuclear magnetic resonances, the excited nuclear magnetic resonances being measured (detected) and MR images being reconstructed based thereon. For spatial encoding of the measurement data, rapidly switched magnetic gradient fields are superimposed on the basic magnetic field. The acquired measurement data are digitized and stored as complex numerical values in a "k-space" matrix. An associated MR image can be reconstructed from the k-space matrix populated with such values by means of, for example, a multi-dimensional Fourier transformation.

A magnetization vector associated with an ensemble of spins that is forced out of its equilibrium alignment (i.e, alignment with the static magnetic field) by an RF pulse seeks to return to its equilibrium position after the RF pulse ends. The position of this magnetization vector (e.g., in degrees) relative to the direction of the static magnetic field represents the extent to which the spins have departed from their equilibrium state. The return to the equilibrium state is referred to as "relaxation", and the return of the component of the magnetization vector parallel to the direction of the basic magnetic field to the original longitudinal direction (equilibrium) is therefore referred to as longitudinal relaxation. Since this relaxation is determined by the spin-lattice (T1) interactions, it is also referred to as spin-lattice or T1 relaxation.

There are also spin-spin interactions, designated as T2 interactions, which result in a loss of phase coherence among the magnetization vectors. This loss of phase coherence is manifest as a decay of the transverse (i.e., perpendicular to the longitudinal axis) component of the magnetization vectors, and is therefore also referred to as transverse or T2 relaxation.

By selectively manipulating different parameters that are used in magnetic resonance pulse sequences, the contributions of the T1 relaxation and the T2 relaxation to the signal from a particular tissue can be manipulated. Manipulation of these contributions has the effect of changing the contrast with which different types of tissues are represented in the resulting magnetic resonance image. In order to highlight a particular tissue type of interest, or to make features of interest more readily identifiable in the resulting magnetic resonance image, the contribution(s) of the T1 relaxation and/or the T2 relaxation is/are manipulated in an intentional manner so as to "weight" the image to set or select a desired contrast. Such images are then referred to as T1-weighted images when T1 differences dominate the image appearance and T2-weighted images when T2 differences dominate the image appearance. In T1-weighted images tissues with a long T1 are dark, whereas in T2-weighted images tissues with a long T2 are bright.

T1-weighted images and T2-weighted images are particularly suitable for use in brain imaging, in order to selectively highlight gray matter and/or white matter and/or brain pathologies. Cerebrospinal fluid (CSF) has a very high water concentration, so that it exhibits a very long T1 relaxation time as well as a very long T2 relaxation time. In T1-weighted images, therefore, CSF will produce only a small signal contribution, and thus will appear dark. In T2-weighted images, however, the same CSF will produce a very high signal, and thus will appear bright.

The magnetic resonance data acquisition parameters also can be selectively adjusted so that the resulting image is neither T1-weighted nor T2-weighted, and thus is primarily influenced solely by the number of signal-producing nuclei per volume element. If hydrogen atoms are being imaged, this type of weighting is referred to as proton density (PD) weighting. For imaging other atoms, this type of weighting is referred to as spin density weighting.

A magnetic resonance data acquisition pulse sequence that begins with an approximately 90° excitation RF pulse followed by an approximately 180° refocusing RF pulse is commonly referred to as a spin echo pulse sequence. Many types of spin echo pulse sequences are known, and spin echo pulse sequences represent a basic family or category of magnetic resonance pulse sequences.

Highly sophisticated spin-echo pulse sequences include a single-slab 3D turbo or fast spin-echo pulse sequence known as, among other names, SPACE (Sampling Perfection with Application optimized Contrasts using different flip angle Evolutions). Pulse sequences of this type allow an extremely large number of refocusing RF pulses (e.g., >300) by using a refocusing RF pulse train exhibiting pulses with respectively different flip angles (<)180° throughout the duration of the echo train. An example variation of the flip angle following a given excitation RF pulse in such a pulse sequence is illustrated by the curve shown in FIG. 2. The shape of such a curve is intentionally designed to achieve desired signal strengths for different types of tissue, and is referred to as a flip angle evolution. Such an evolution is designed for obtaining a specific contrast (such as in proton density-weighted images or T1-weighted images or T2-weighted images) between the imaged tissues. FIG. 3 shows an example of normalized signals strengths respectively for CSF, gray matter and white matter, with respect to time, obtained in a T2-weighted image using the flip angle evolution shown in FIG. 2. With this echo train, an optimal T2-weighted contrast between the tissues is obtained by setting the echo time around the middle portion of the echo train.

The example of FIGS. 2 and 3 shows a signal evolution that has an echo-train duration on the lower end of those used for SPACE-type pulse sequences. Echo-train durations up to 1 second are commonly used and durations of several seconds may be used for certain applications. For obtaining a proton density-weighted contrast, however, the echo train is typically no more than approximately several hundred milliseconds. The reordering of the encoding is such that earlier echoes are entered in the central portion of k-space. Therefore, the proton density-weighted evolution is essentially the first part of the evolution that occurs for T2-weighted contrast.

SUMMARY OF THE INVENTION

It is an object of the present invention to provide a method and an apparatus for acquiring magnetic resonance imaging data with different types of contrast weightings in a more efficient manner than has been conventionally accomplished.

The above object is achieved in accordance with the present invention in a method and an apparatus for acquiring magnetic resonance data wherein a region of a subject is exposed to a magnetic resonance pulse sequence exhibiting a refocusing-RF-pulse flip angle evolution that causes spins in the region to produce an echo train with a signal evolution following each excitation RF pulse. Each signal evolution is sampled to extract two or more sampled sets of data therefrom, respectively with different contrast weightings of tissues in the region. The multiple sets of sampled data in k-space are thus available to obtain multiple different magnetic resonance images with multiple respectively different types of contrast weightings.

The basis of the method and apparatus according to the present invention is to simultaneously extract multiple contrasts from the same signal evolution, using a designed signal evolution. For example, in the case of proton density-weighted images and T2-weighted images, use is made of the fact noted above that the portion of the signal that is extracted for proton density-weighted contrast is essentially an earlier part of the same signal evolution that is sampled for producing a T2-weighted image. Therefore, respectively different portions of the same signal evolution are sampled in order to obtain the respective images with different contrasts from the same echo train. The respective portions of the echo train that are sampled for obtaining the respectively two different types of weightings can be non-overlapping, or may partially overlap, or one may be contained in the other. As another example, a very long (>1 second) signal evolution may be employed wherein the first portion is used to generate a T2-weighted image and the second portion is used to generate a heavily T2-weighted image, such as commonly used for depicting fluid-containing structures such as the biliary system.

The magnetic resonance pulse sequence that is employed is preferably a turbo of fast spin-echo pulse sequence, and most preferably is a single-slab 3D pulse sequence, such as the SPACE sequence. The turbo or fast spin-echo pulse sequence that is employed preferably has a turbo factor>300, and the signal evolution (echo train) preferably has a duration of more than approximately 250 ms.

DESCRIPTION OF THE PREFERRED EMBODIMENTS

Figure 1:
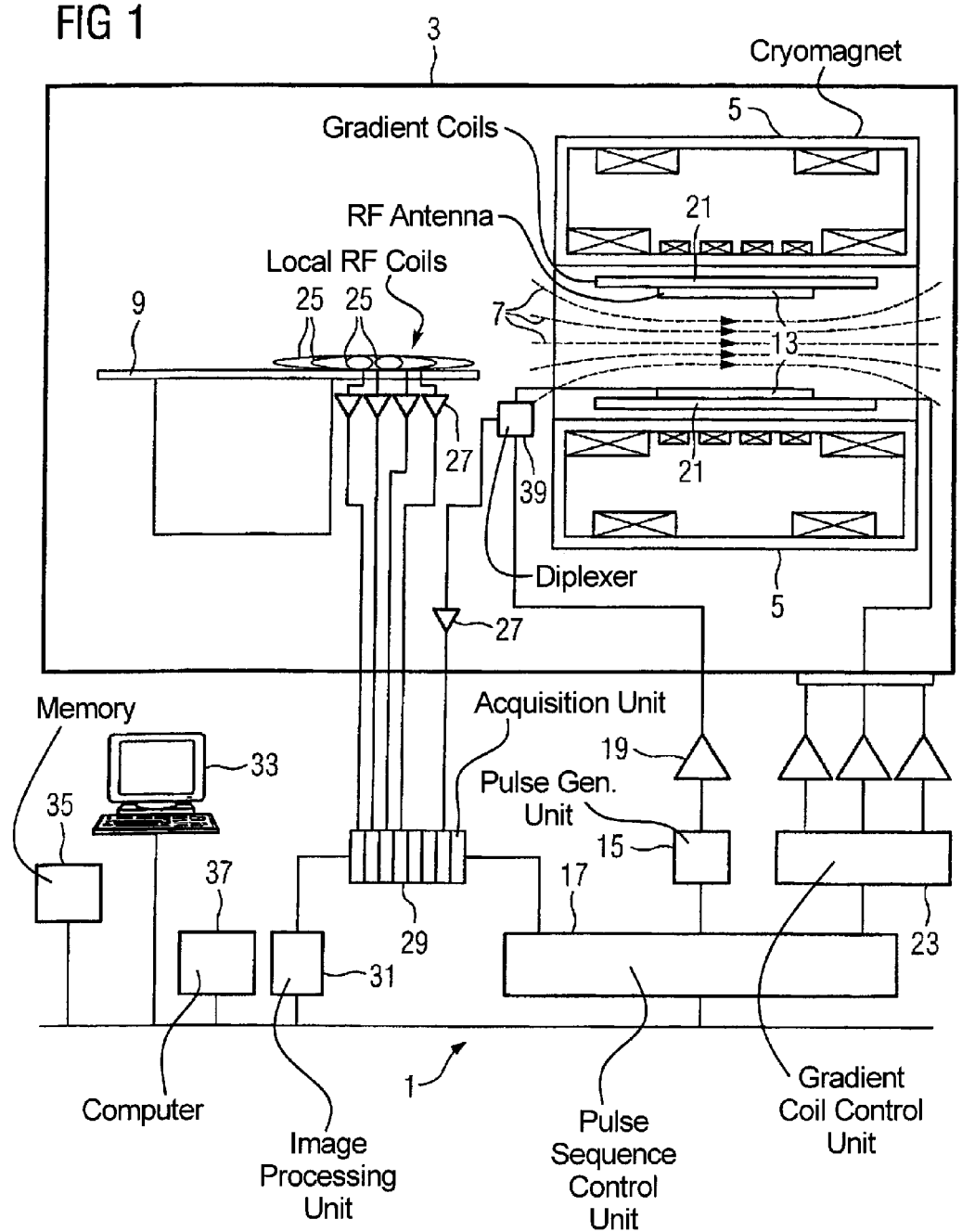
FIG. 1 schematically illustrates the basic components of a magnetic resonance system constructed and operating in accordance with the present invention.

FIG. 1 schematically shows the design of a magnetic resonance apparatus 1 with its basic components. In order to examine a body by means of magnetic resonance imaging, various magnetic fields matched to one another as precisely as possible in terms of their temporal and spatial characteristics are applied.

A strong magnet (typically a cryomagnet 5 with a tunnel-shaped opening) arranged in a radio-frequency shielded measurement chamber 3 generates a static, strong basic magnetic field 7 that typically amounts to 0.2 Tesla to 3 Tesla and more. A body or a body part (not shown here) to be examined is borne on a patient bed 9 and positioned in the homogeneous region of the basic magnetic field 7.

The excitation of the nuclear spins of the body ensues via magnetic radio-frequency excitation pulses that are radiated via a radio-frequency antenna (shown here as a body coil 13). The radio-frequency excitation pulses are generated by a pulse generation unit 15 that is controlled by a pulse sequence control unit 17. After an amplification by a radio-frequency amplifier 19 they are relayed to the radio-frequency antenna. The radio-frequency system shown here is merely schematically indicated. Typically more than one pulse generation unit 15, more than one radio-frequency amplifier 19 and multiple radio-frequency antennas are used in a magnetic resonance apparatus 1.

Furthermore, the magnetic resonance apparatus 1 has gradient coils 21 with which magnetic gradient fields for selective slice excitation and for spatial encoding of the measurement signal are radiated in a measurement. The gradient coils 21 are controlled by a gradient coil control unit 23 that, like the pulse generation unit 15, is connected with the pulse sequence control unit 27.

The signals emitted by the excited nuclear spins are acquired by the body coil 13 and/or by local coils 25, amplified by associated radio-frequency preamplifiers 27 and processed further and digitized by an acquisition unit 29.

Given a coil (such as, for example, the body coil 13) that can be operated both in transmission mode and in acquisition mode, the correct signal relaying is regulated by an upstream transmission-reception diplexer 39.

An image processing unit 31 generates from the measurement data an image that is presented to a user via an operator console 33 or is stored in a memory unit 35. A central computer 37 controls the individual system components. The computer 37 is thereby fashioned such that the method according to the invention can be implemented by suitable programming of the computer 37.

Figure 2:
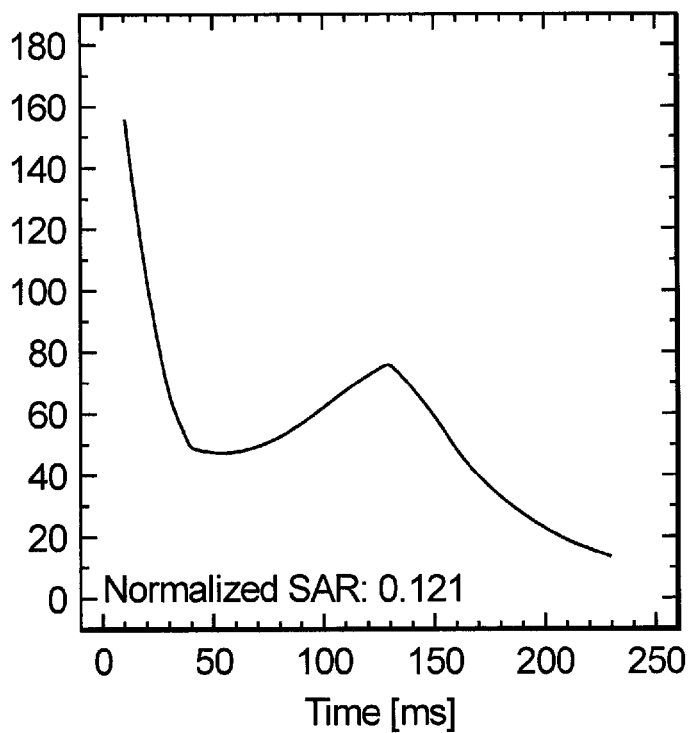
FIG. 2, as noted above, is a graph illustrating an example flip angle evolution in a SPACE-type pulse sequence.
Figure 3:
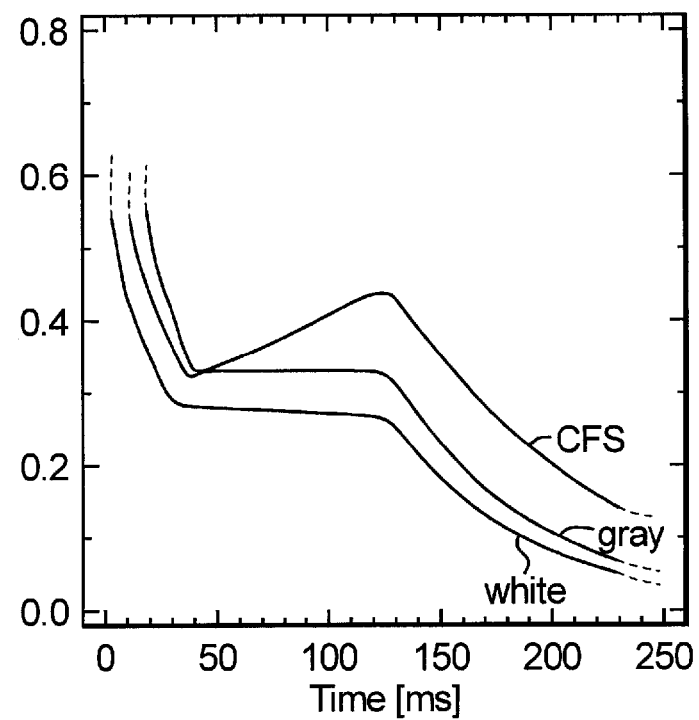
FIG. 3, as noted above, is a graph illustrating respective signal evolutions corresponding to a T2-weighted image obtained with the flip angle evolution shown in FIG. 2, for CSF, gray matter and white matter.

The basic principles of the present invention will be explained using FIG. 4, based on an exemplary embodiment wherein a flip angle distribution of the type shown in FIG. 2 is employed to obtain T2-weighted signals for CSF, gray matter and white matter, of the type shown in FIG. 3.

Figure 4:
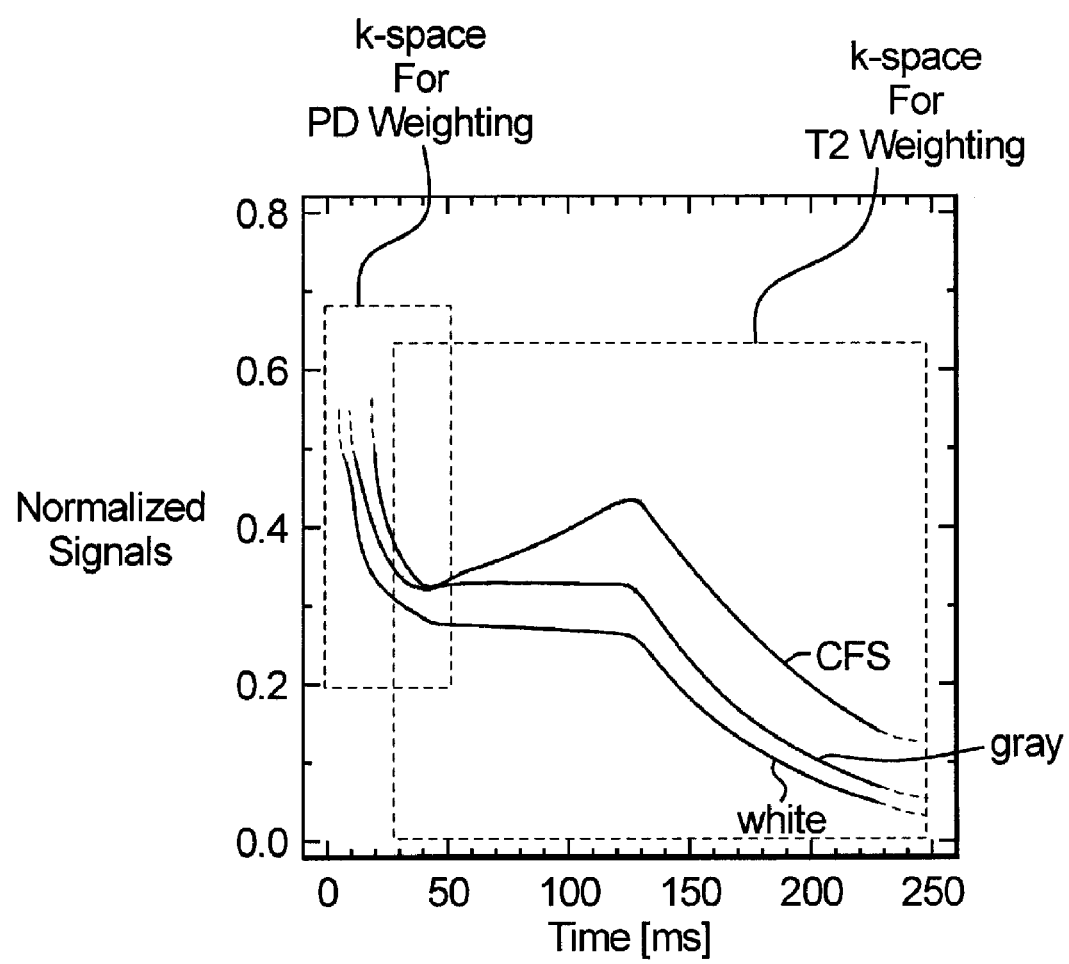
FIG. 4 is a graph that schematically illustrates the method in accordance with the present invention.

In accordance with the present invention, as shown in FIG. 4, the first part of the echo train may be used to generate k-space data for a proton density-weighted image set. A latter part of the same echo train may be used to generate k-space data for a T2-weighted image data set, of the type also shown in FIG. 2. Some portion of the data may be shared between the two contrasts, i.e., the shared data may be used in k-space for both image sets.

Implementation of such a pulse sequence and the sampling thereof results in the simultaneous acquisition of two contrasts, namely proton density-weighted and T2-weighted, in this example, at the same anatomic position. It is of course also possible to obtain other types of contrast weightings, such as T1-weighted contrast, or more than two contrasts.

In order to completely fill k-space for the proton density-weighted image set, additional excitations may be necessary, compared to the number required for collecting a T2-weighted data set alone. Nevertheless, the total measurement time still will be substantially less than that required for separately acquiring data sets respectively for the two different contrasts.

In summary, the method and apparatus in accordance with the present invention result in the generation of a specific signal evolution (in sequences where this is possible, such as SPACE) that permits the extraction of selected contrasts from different parts of the signal evolution. These different parts may overlap, or may be completely separated from each other, or one may be contained in the other. The flip angle evolution and the resulting signal evolution will depend on the desired contrasts.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for acquiring magnetic resonance data, comprising the steps of:
    exposing a region of a subject to a spin-echo magnetic resonance pulse sequence comprising an excitation RF pulse and multiple refocusing RF pulses that exhibit a flip angle evolution, and that cause magnetic resonance signals to be emitted from the region as an echo train;
    prescribing said flip angle evolution to cause a signal evolution in said echo train resulting in contrast between tissues in said region;
    sampling a first part of said signal evolution to obtain a first set of k-space data with a non-T2-weighted first type of weighting of said contrast, and sampling a second part of said signal evolution to obtain a second set of k-space data with a second type of weighting of said contrast, until a desired number of contrast weightings are sampled; and
    making said first set of k-space data available as a first electronic output in a form from which a first image of said region can be generated with said non-T2-weighted first type of weighting of said contrast, and making said second set of k-space data available as a second electronic output in a form from which a second image of said region can be generated with said second type of weighting of said contrast, until all of said images of said region with said contrast weightings can be generated.

2. A method as claimed in claim 1 comprising sampling said signal evolution with said parts not overlapping.

3. A method as claimed in claim 1 comprising sampling said signal evolution with at least two of said parts partially overlapping.

4. A method as claimed in claim 1 comprising sampling said signal evolution with at least one of said parts contained within another of said parts.

5. A method as claimed in claim 1 comprising employing a turbo or fast spin-echo sequence as said spin-echo sequence.

6. A method as claimed in claim 5 comprising employing a single-slab three-dimensional pulse sequence as said turbo or fast spin-echo sequence.

7. A method as claimed in claim 6 comprising employing the SPACE sequence as said single-slab three-dimensional pulse sequence.

8. A method as claimed in claim 5 comprising employing a turbo or fast spin-echo sequence having a turbo factor of greater than 300.

9. A method as claimed in claim 1 comprising generating said signal evolution with a duration of at least approximately 250 ms.

10. A method as claimed in claim 1 comprising sampling two contrast weightings and comprising sampling said first part of said signal evolution to obtain said first set of k-space data with proton density weighting as said non-T2-weighted first type of weighting of said contrast, and sampling said second part of said signal evolution to obtain said second set of k-space data with T2-weighting as said second type of weighting of said contrast.

11. A method for acquiring magnetic resonance data comprising the steps of:
    exposing a region of a subject to a spin echo magnetic resonance pulse sequence including a refocusing-RF-pulse flip angle evolution that causes magnetic resonance signals to be emitted from said region exhibiting a signal evolution;
    sampling said signal evolution to extract at least two overlapping sets of sampled data therefrom respectively with different contrast weightings of tissues in said region; and
    making said at least two sets of sampled data available in a form allowing multiple different images of said region to be generated therefrom respectively with said different contrast weightings.

12. A method as claimed in claim 11 comprising employing a turbo or fast spin-echo sequence as said spin-echo sequence.

13. A method as claimed in claim 12 comprising employing a single-slab three-dimensional pulse sequence as said turbo or fast spin-echo sequence.

14. A method as claimed in claim 13 comprising employing the SPACE sequence as said single-slab three-dimensional pulse sequence.

15. A method as claimed in claim 11 comprising sampling two contrast weightings and comprising sampling said signal evolution to extract a first set of said sampled data with proton density weighting and to extract a second set of said sampled data with T2-weighting.

16. A magnetic resonance system comprising:
    a magnetic resonance scanner configured to acquire magnetic resonance data from a subject by exposing a region of the subject to a spin-echo magnetic resonance pulse sequence comprising an excitation RF pulse and multiple refocusing RF pulses that exhibit a flip angle evolution, and that cause magnetic resonance signals to be emitted from the region as an echo train;
    a controller that prescribes said flip angle evolution to cause a signal evolution in said echo train resulting in contrast between tissues in said region;
    a computer configured to sample a first part of said signal evolution to obtain a first set of k-space data with a non-T2-weighted first type of weighting of said contrast, to sample a second part of said signal evolution to obtain a second set of k-space data with a second type of weighting of said contrast, and so forth until the desired number of contrast weightings are sampled; and
    said computer being configured to make said first set of k-space data available as a first electronic output in a form from which a first image of said region can be generated with said non-T2-weighted first type of weighting of said contrast, to make said second set of k-space data available as a second electronic output in a form from which a second image of said region can be generated with said second type of weighting of said contrast, and so forth for the desired number of contrast weightings.

17. A magnetic resonance system comprising:

a magnetic resonance scanner configured to acquire magnetic resonance data from a subject by exposing a region of the subject to a spin-echo magnetic resonance pulse sequence comprising an excitation RF pulse and multiple refocusing RF pulses that exhibit a flip angle evolution, and that cause magnetic resonance signals to be emitted from the region as an echo train;

a controller that prescribes said flip angle evolution to cause a signal evolution in said echo train resulting in contrast between tissues in said region;

a computer supplied with said magnetic resonance signals that samples said signal evolution to extract at least two overlapping sets of sampled data therefrom respectively with different contrast weightings of tissues in said region; and said computer making said at least two sets of sampled data available in a form allowing multiple different images of said region to be generated therefrom respectively with said different contrast weightings.

* * * * *